United States Patent
Rocha-Alvarez et al.

(10) Patent No.: US 12,476,092 B2
(45) Date of Patent: Nov. 18, 2025

(54) AFE (ACTIVE FAR EDGE) HEATER/BIPOLAR ESC WITH SIMPLIFIED AND OPTIMIZED STRUCTURE FOR GREATER RELIABILITY, LOWER COST AND BETTER MANUFACTURABILITY

(71) Applicant: Applied Materials, Inc., Santa Clara, CA (US)

(72) Inventors: Juan Carlos Rocha-Alvarez, San Carlos, CA (US); Jian Li, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 259 days.

(21) Appl. No.: 18/317,742

(22) Filed: May 15, 2023

(65) Prior Publication Data

US 2024/0387154 A1    Nov. 21, 2024

(51) Int. Cl.
*H01J 37/32*    (2006.01)
*H01L 21/683*    (2006.01)

(52) U.S. Cl.
CPC .. *H01J 37/32724* (2013.01); *H01J 37/32541* (2013.01); *H01J 37/32577* (2013.01); *H01J 2237/032* (2013.01); *H01J 2237/2007* (2013.01); *H01J 2237/334* (2013.01); *H01L 21/6833* (2013.01)

(58) Field of Classification Search
CPC ......... H01L 21/67103; H01L 21/68735; H01L 21/6831; H01L 21/6833; H01J 37/32577; H01J 37/32541; H01J 37/32724; H01J 2237/334; H01J 2237/2007; H01J 2237/032

USPC ......................................................... 361/234
See application file for complete search history.

(56) References Cited

U.S. PATENT DOCUMENTS

| 11,049,755 | B2 | 6/2021 | Benjaminson et al. |
| 2001/0046112 | A1 | 11/2001 | Herchen |
| 2009/0314433 | A1 | 12/2009 | Hoffman et al. |
| 2017/0018411 | A1 | 1/2017 | Sriraman et al. |
| 2020/0161106 | A1 | 5/2020 | Takahashi |

FOREIGN PATENT DOCUMENTS

| JP | 5896595 B2 * | 3/2016 | |
| KR | 20220082946 A | 6/2022 | |
| WO | WO-2023146864 A1 * | 8/2023 | ........ H01J 37/32174 |

OTHER PUBLICATIONS

Machine translation of Kimura et al. Japanese Patent Document JP 5896595 B2 Mar. 2016 (Year: 2016).*
PCT/US2024/021402, International Search Report and Written Opinion dated Jul. 8, 2024, 10 pages.

* cited by examiner

*Primary Examiner* — Kevin J Comber
(74) *Attorney, Agent, or Firm* — Patterson + Sheridan, LLP

(57) ABSTRACT

A method and apparatus for a substrate support, comprising a ceramic body, at least one heater, at least one chucking electrode, and a unitary plasma support structure comprising an electrical connection portion, at least one electrical distribution portion, and annular electrode connected to the electrical connection portion by the at least one electrical distribution portion, the electrical connection portion, at least one electrical distribution portion, and annular electrode configured of a unitary sheet of a conductive fiber mesh.

14 Claims, 3 Drawing Sheets

AFE (ACTIVE FAR EDGE) HEATER/BIPOLAR ESC WITH SIMPLIFIED AND OPTIMIZED STRUCTURE FOR GREATER RELIABILITY, LOWER COST AND BETTER MANUFACTURABILITY

BACKGROUND

Field

Embodiments of the present disclosure generally relate to apparatus and methods for fabricating semiconductor devices. More specifically, apparatus disclosed herein relate to an electrostatic chuck assembly for use in a plasma processing chamber.

Description of the Related Art

The fabrication of microelectronic devices typically involves a complicated process sequence requiring hundreds of individual processes performed on semi-conductive, dielectric, and conductive substrates. Examples of these processes include oxidation, diffusion, ion implantation, thin film deposition, cleaning, etching, and lithography, among other operations. Each operation is time consuming and expensive.

One issue encountered in plasma processing of substrates during the processes used to form microelectronic device is control of the plasma properties over the span of the substrate. Where the substrate, or substrate support, is biased in order to attract ions toward the substrate, if the plasma region terminates adjacent to the circumferential edge of the substrate, the ion trajectories at the substrate edge may cause excessive etching away of material at the substrate edge or deleteriously impact film layers previously deposited on the substrate. Therefore there is a need to provide better control of the plasma at the substrate edge.

SUMMARY

Examples of a substrate support are provided herein having an embedded plasma support electrode disposed adjacent to the outer peripheral surface of the electrostatic chuck, whereby electrical biasing of the electrode can be used to modify the properties of the plasma over the substrate and the adjacent portions of the substrate support extending radially outwardly of the substrate when supported thereon. In some examples, the substrate support provides a ceramic electrostatic chuck having a body. The body has a first side configured to support a substrate and a second side opposite the first side. The body has a stack comprising, a chucking electrode, a unitary spoke mesh, and a multi ring heater. The unitary spoke mesh further comprises a center stub, an annular active edge electrode and a plurality of spokes extending from the center stub to the active edge electrode, all disposed below the chucking electrode. The spoke mesh integrally comprises the center stub, spokes, and active edge electrode is one unitary mesh piece. The multi-ring heater comprises an inner heater surrounded annularly by an outer ring heater.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

In the present disclosure, an electrostatic chuck assembly is provided which has an a unitary spoke mesh comprising an edge ring within a ceramic body, a plurality of spokes, and a central electrical connection region formed of a single piece of conductive wire mesh. The ceramic body has a substrate support surface, which is configured to support a substrate during plasma processing. The ceramic plate has a chucking electrode, for example two D shaped chucking electrodes facing, and immediately below, the substrate support surface of the ceramic body, which are configured in conjunction with a power supply to electrostatically chucking the substrate to the support surface. Below, in other words further inwardly of the electrostatic chuck assembly from the substrate support surface than the chucking electrode, is the unitary spoke mesh. The unitary spoke mesh comprises a center stub for connection to an electrical power source, an annular active edge electrode and a plurality of spokes extending from the center stub to the active edge electrode. The center stub of the unitary spoke mesh includes a power supply line connection connectable to a wire directed to a power supply. The active edge electrode of the unitary spoke mesh is extended to just inwardly of the very edge of the ceramic body, and when powered can be used to modify properties of a plasma adjacent to the substrate edge. The ceramic body further includes heaters below the unitary spoke mesh, in other words such that the spoke mesh is between the heaters and the substrate support surface, which heaters are connectable to a power supply wire directed to a power supply. The heaters can heat the substrate up to on the order of 700 degrees C.

Advantageously, the high temperature electrostatic chuck assembly can perform both PECVD/PEALD deposition as well as in-situ etch/treatment processes all while using the same ceramic body. The electrostatic chuck assembly enables improved film edge coverage using the active edge electrode of the unitary spoke mesh.

Figure 1:
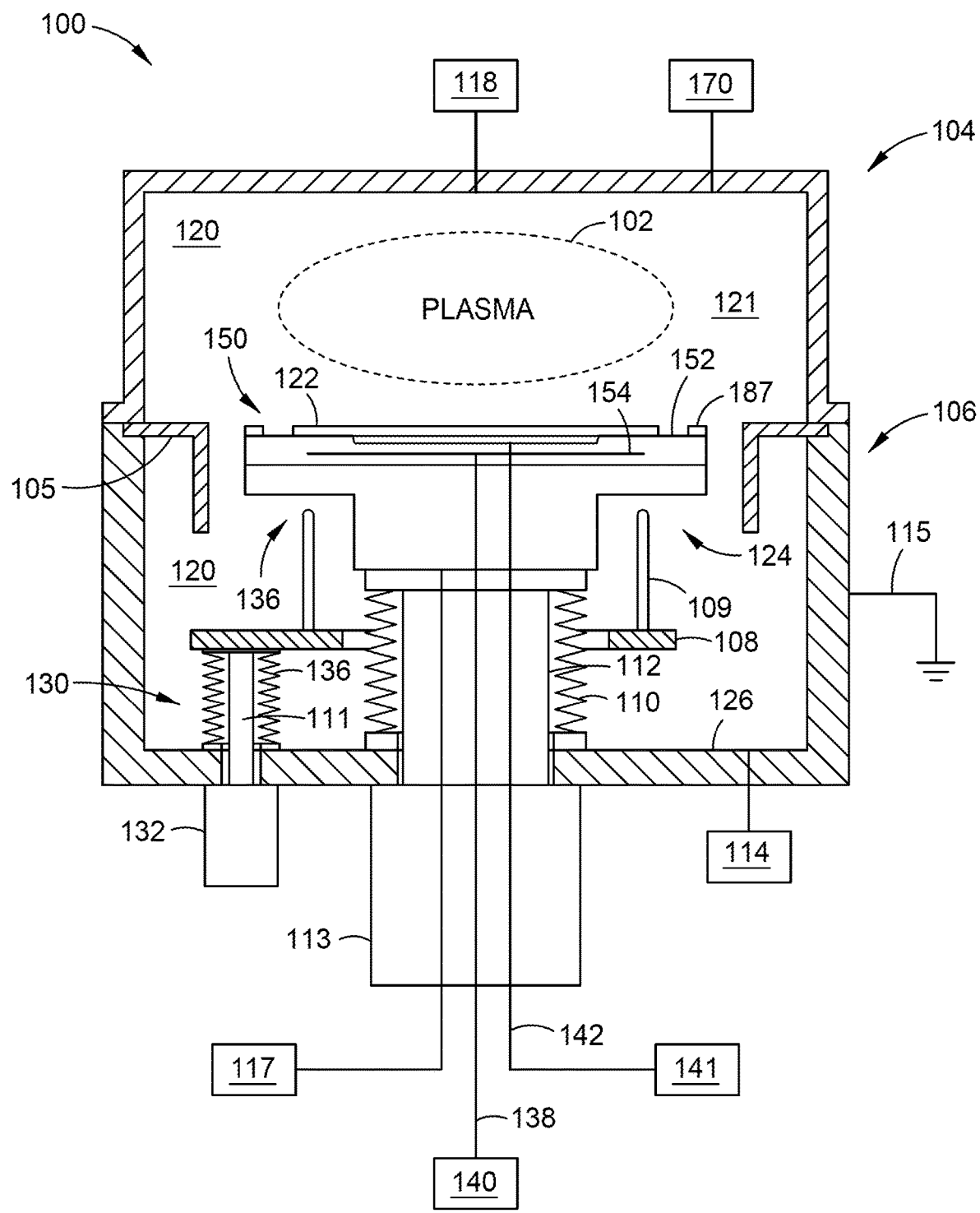
FIG. 1 is a schematic side view of a process chamber having a substrate support in accordance with at least some examples of the present disclosure.

FIG. 1 depicts a schematic side view of a plasma processing chamber 100 having a substrate support 124 in accordance with at least some examples of the present disclosure. In some examples, the plasma processing chamber 100 is an etch processing chamber. However, other types of processing chambers configured for different processes can also use or be modified for use with examples of the substrate support 124 described herein.

The plasma processing chamber 100 is a vacuum chamber that is suitably adapted to maintain sub-atmospheric pressures within a chamber interior volume 120 during substrate processing. The plasma processing chamber 100 includes a chamber body 106 covered by a lid 104 which encloses a processing volume 121 located in the upper portion of the chamber interior volume 120 and generally above the substrate support 124. The plasma processing chamber 100 may also include one or more liners 105 circumscribing various chamber components to prevent unwanted reaction between such components and the gases of the processing environment within the chamber 100. The chamber body 106 and lid 104 may be made of metal, such as aluminum. The chamber body 106 may be grounded via a coupling, such as a ground strap, to ground 115.

The substrate support 124 is disposed within the chamber interior volume 120 to support and retain a substrate 122 thereon, such as a semiconductor wafer. The substrate support 124 may generally comprise an electrostatic chuck assembly 150 and a hollow support shaft 112 for supporting the electrostatic chuck assembly 150. The electrostatic chuck assembly 150 comprises an electrostatic chuck 152 having one or more chucking electrodes 154 disposed therein. An edge ring 187 is disposed on a peripheral upper region 158 the substrate support 124 and it circumscribes a substrate support region 156 on which a substrate 122 is positioned for processing within the chamber 100. The electrostatic chuck 152 electrostatically chucks the substrate 122 to the substrate support 124.

The hollow support shaft 112 provides a conduit to provide, for example, backside gases through backside gas lines, process gases through process gas lines, fluids through fluid lines, coolants through coolant lines, power cabling, or the like, to the substrate support 124. In some examples, the hollow support shaft 120 is attached to a bottom surface of the plasma chamber body 106 and the substrate support 124 is fixed in the processing chamber 100. In other examples, the hollow support shaft 112 is coupled to a lift mechanism 113, such as an actuator or motor, which provides vertical movement of the electrostatic chuck assembly 150 between an upper, processing position (as shown in FIG. 1) and a lower, transfer position (not shown). A bellows assembly 110 is disposed about the hollow support shaft 112 and is coupled between the electrostatic chuck assembly 150 and a bottom surface 126 of plasma processing chamber 100 to provide a flexible seal that allows vertical motion of the electrostatic chuck assembly 150 while preventing loss of vacuum from within the plasma processing chamber 100.

The hollow support shaft 112 provides a conduit for coupling wiring or other electrical conductors between a negative pulsed DC power source 140, a bias power supply 117 to the electrostatic chuck assembly 150, as well as, where desired, a conduit for a backside gas supply 141 to supply gas between through optional passages in the electrostatic chuck assembly 150 and openings in the substrate receiving portion 156 of the substrate and thereby locate a heat transfer gas between a substrate and the electrostatic chuck assembly 150. In some examples, the bias power supply 117 includes one or more RF bias power sources. Where the backside gas supply 141 is used, it is disposed outside of the chamber body 106 and supplies heat transfer gas to the electrostatic chuck assembly 150 through a conduit in the hollow support shaft. In some examples, the substrate support 124 may alternatively include AC, DC, or RF bias power.

The substrate support 124 may, or may not, include a substrate lift assembly 130. The substrate lift assembly 130 may include lift pins 109 mounted on a platform 108 connected to a shaft 111 which is coupled to a second lift mechanism 132 for raising and lowering the platform 108 and pins 109 so that the substrate 122 may be placed on or removed from the electrostatic chuck assembly 150. The electrostatic chuck assembly 150 includes through holes to receive the lift pins 109. A bellows assembly 131 is coupled between the substrate lift assembly 130 and the bottom surface 126 to provide a flexible seal that maintains the chamber vacuum during vertical motion of the substrate lift 130. Alternately, the substrate lift assembly 130 may be included entirely inside the processing chamber 100, for example within the substrate support assembly 124.

The plasma processing chamber 100 is coupled to and in fluid communication with a pumping system 114 that includes a throttle valve (not shown) and vacuum pump (not shown) which are used to exhaust the plasma processing chamber 100. The pressure inside the plasma processing chamber 100 may be regulated by adjusting the throttle valve and/or vacuum pump. The plasma processing chamber 100 is also coupled to and in fluid communication with a process gas supply 118 that may supply one or more process gases to the plasma processing chamber 100 for processing the substrate 122 disposed therein.

In operation, a plasma 102 is created in the chamber interior volume 120 to perform one or more processes. The plasma 102 may be created by coupling power from a plasma power source (e.g., RF plasma power supply 170) to a process gas via one or more electrodes (for example a coil not shown) near and exterior to the lid 104, or within the chamber interior volume 120, to ignite the process or other gas therein into a plasma 102. A bias power may also be provided from the bias power supply 117 to the one or more chucking electrodes 154 within the electrostatic chuck assembly 150 (in addition to the chucking power) to attract ions from the plasma 102 towards the substrate 122 to etch the exposed upper surface of the substrate 122. Alternatively, a separate substrate/body biasing electrode may be buried within the ceramic body and connected to a separate or common power supply. The RF plasma power supply 170 may provide RF energy at a frequency of about 40 MHz or greater to the processing chamber 100 for maintaining the plasma 102 therein.

Figure 2A:
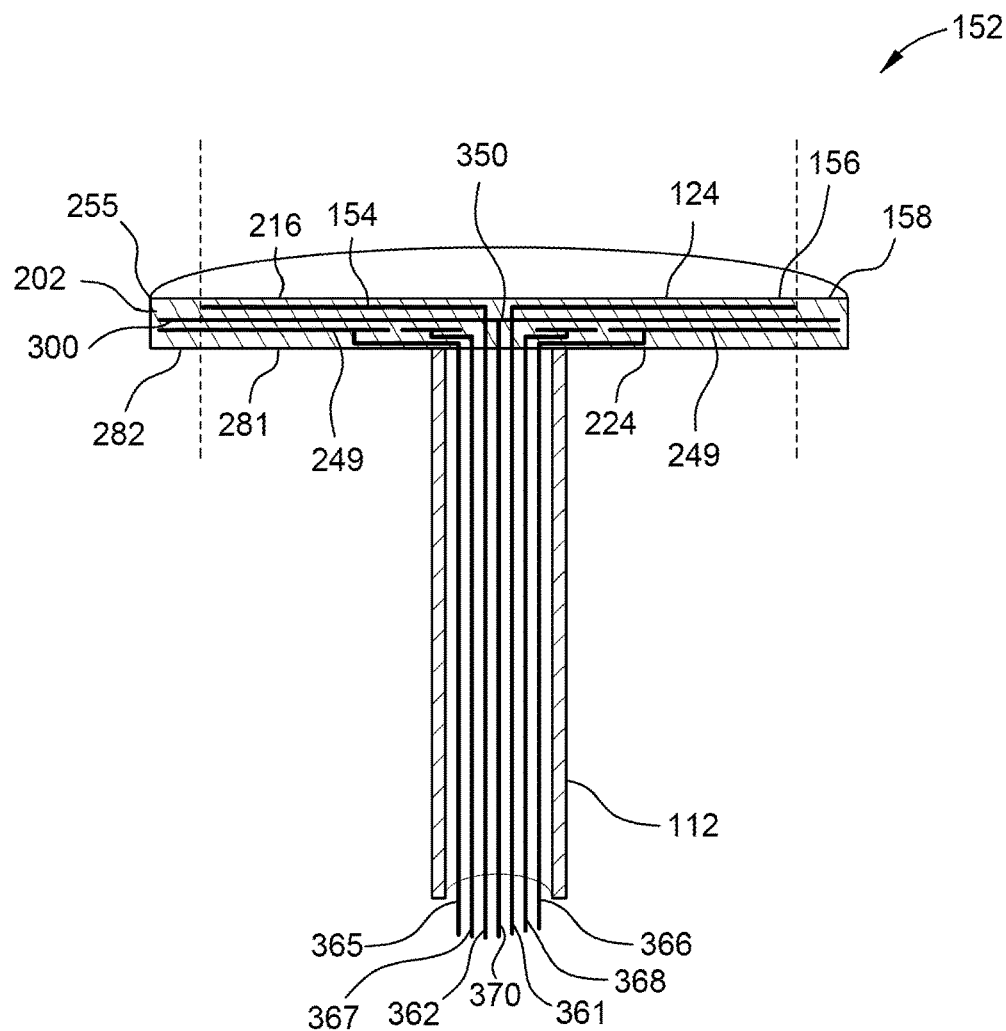
FIG. 2A is a schematic partial side view of the substrate support in accordance with one example of the present disclosure.
Figure 2B:
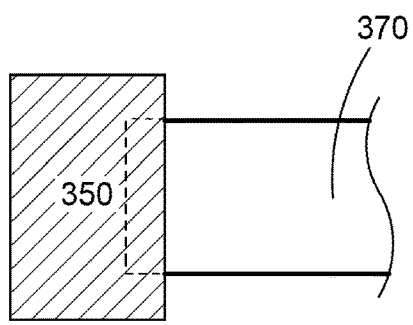
FIG. 2B is a side view of the power source connection in accordance with one example of the present disclosure.
Figure 3A:
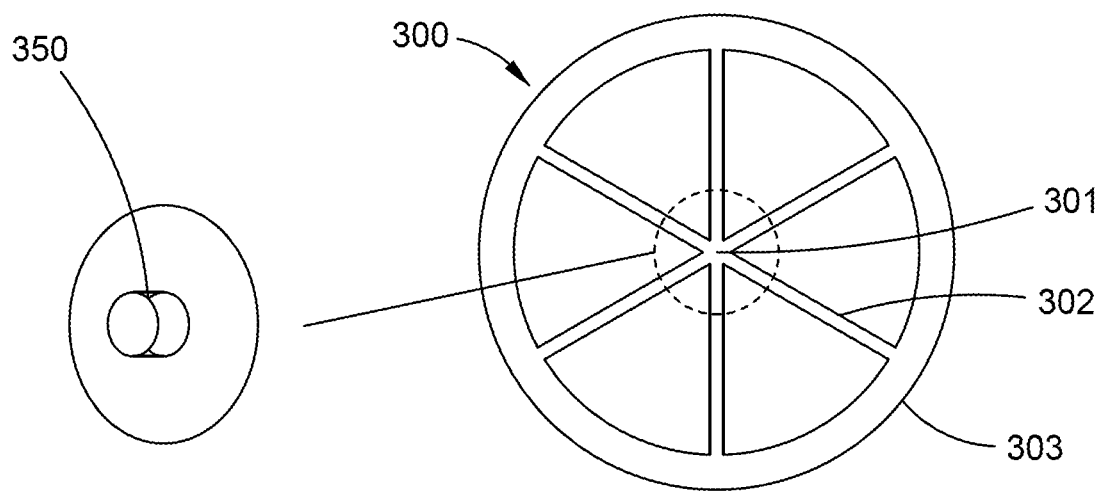
FIG. 3A is a detailed view of the unitary spoke mesh.
Figure 3B:
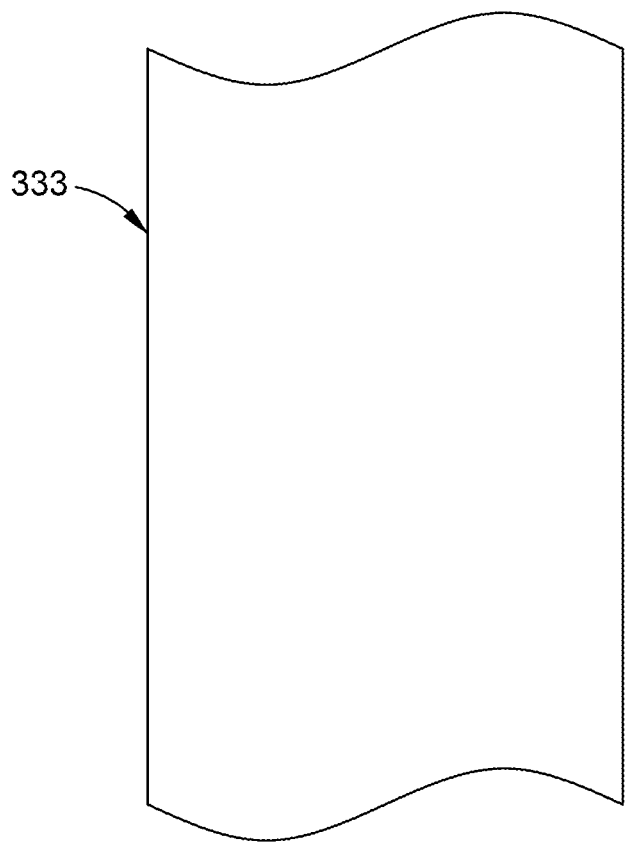
FIG. 3B is view of the sheet of conductive wire mesh.

FIG. 2 depicts a schematic partial side view of the substrate support 124 in accordance with at least one example of the present disclosure. The electrostatic chuck assembly 150 has a body 202. The body 202 may be uniformly formed of a ceramic material. In one example, the body 202 is made of AlN, $Al_2O_3$, quartz, or other suitable material. The body 202 of the electrostatic chuck 152 is fabricated in the form of a ceramic plate or right annular disk with electrodes embedded therein. The body 202 of the electrostatic chuck 152 is made for example by aligning the stack of the chucking electrode, the unitary spoke mesh, and the heater within a body mold. The mold is filled with ceramic powder and fused into a unitary body in a heating apparatus with the stack embedded within. For example, ceramic powder for the portion of the body forming the substrate support and edge ring regions thereof is first placed into a mold, and then the chucking electrodes are placed over that powder. Additional powder is supplied, and additional electrodes such as the spoke mesh for providing the edge electrode for plasma modification, is located thereover. This sequence is repeated until all of the electrodes and the ceramic power to manufacture the body are present in the mold. Additionally, a conductive plug is preferable electrically and physically connected to each of the electrodes when placed into the mold, to allow for tolerance when drilling holes through the non-substrate support body of the body after the ceramic is fired to fuse it together and form the body 202 of the electrostatic chuck assembly. This ceramic powder with embedded electrodes is then forged to the ceramic fusing temperature to form a single ceramic piece comprising the body with the electrodes embedded therein.

After firing and cooling, the ceramic body 202 is then drilled using to form holes from the underside of the body to the conductive plugs connected to a first electrostatic chuck electrode, a second electrostatic chuck electrode, a first heater, a second heater, and the spoke mesh. Then, a brazing compound is placed over each of the plugs, and a first electrostatic chuck wire 361, a second electrostatic chuck wire 362, a first heater wire 365, a second heater wire 366, a third heater wire 367, a fourth heater wire 368 and a spoke mesh wire are contacted with the respective ones of the brazing material contacting the conductive plugs of the first electrostatic chuck electrode, second electrostatic chuck electrode, first heater, second heater, and the spoke mesh. Each of these wires can be in the form of a stiff rod shaped conductor. The wires, and the body 202, are held in relative positions to one another using appropriate fixturing and placed into a furnace where they are heated to above the solidus or melting temperature of the brazing material, to allow each of the wires to become physically and electrically connected to their respective component through the conductive plug. The brazing compound will bond to the mesh and the rod, and then the assembly is allowed to cool and the fixturing is removed. The hollow support shaft may be similarly connected during this brazing process using appropriate brazing material between connecting end of the hollow shaft 112 and the underside of the body.

The body 202 includes a first side 216 configured to support the substrate 122 and a second side 224 opposite the first side 216. The electrostatic chuck 152 has an outer diameter 255. The body 202 has an inner portion 281 and an outer portion 282, the inner portion 281 extending from the center of the electrostatic chuck 152 and the outer portion 282 extending from the edge of the inner portion 281 to the outer diameter 255 and surrounding the inner portion 281. The substrate 122 is disposed on the inner portion 281 and the edge electrode 303 is disposed on the outer portion 282. The body 202 thickness between the first side 216 and the second side 224 is between about 18 mm and 22 mm, such as about 20 mm.

The one or more chucking electrodes 154 are embedded in the inner portion 281 of the body 202 immediately adjacent to the first side 216. The chucking electrodes 154, when energized, electrostatically chuck the substrate 122 to the first side 216 of the electrostatic chuck 152. The one or more chucking electrodes 154 may be monopolar or bipolar. In some examples, the electrostatic chuck 152 provides Coulombic chucking. In some examples, the electrostatic chuck 152 provides Johnsen-Rahbek chucking.

Embedded below the chucking electrode 154 is the spoke mesh, here configured as a unitary, in other words, single continuous piece of woven conductive fibers, for example conductive wires, forming a unitary spoked mesh 300. The unitary spoked mesh 300 is formed from a unitary mesh sheet 333 that is for example less than 0.1 to approximately 1.0 mm thick. The thickness of the mesh is limited only by the power that needs to flow into and through the unitary mesh dictating the thickness of the conductive fibers (conductive wires) required in the mesh. The mesh is, for example, composed of a woven mat or sheet 333 of individual nickel molybdenum wires, each wire having a thickness of diameter on the order of 0.05 to 1.0 mm or greater. The individual wires in the unitary mesh sheet 333 comprises for example, a cross pattern, where one plurality of wire runs in a first direction and the second plurality runs in a second direction orthogonal to the first direction, and each wire extending in the first direction alternatingly crosses below a wire, then over the next wire, below the next wire, etc. of the second plurality of wires. Three sets of wire each set oriented with their lengths in one of a first, second and third direction may also be employed, where each of the first second and third directions are offset from one another by 60 degrees. Other patterns are also appropriate. The unitary spoke mesh 300 formed from the unitary mesh sheet 333 comprises a center stub portion 301, a plurality of spokes 302 extending from the center stub, and an outer active edge electrode 303, which are cut, for example, from a continuous sheet of mesh, using for example laser cutting or cutting. A conductive plug 350 is brazing to the center stub portion 301 which, when the ceramic body is drilled post firing, allows the holes to be drilled without drilling onto or through the mesh. The active edge electrode 303 extends as an annular circumferentially extending portion of the mesh within the outer portion 281 of the body 202, extending from the edge of the inner portion 281 to inwardly of the outer diameter 255 of the body 202, for example to within 3 or 2.5 mm of the outer circumference of the body 202. As such, the active edge electrode 303 extends beyond the outer edge of the one or more chucking electrodes 154 embedded in the inner portion 281 of the body 202, and to a location radially outward of the substrate receiving portion of the body 202. For example, where the body is intended to support a 300 mm diameter substrate thereon, the substrate receiving portion 156 can be on the order of slightly over 150 mm to 155 mm in radius centered at the center of the substrate receiving portion 156 of the body, and surrounded by the outer peripheral portion 158 of the body 202. The inner radius of the active edge electrode can extend to be under the substrate receiving region 156, and radially outwardly thereof to extend under the outer peripheral portion 158.

The unitary spoked mesh 300 is manufactured within a single plane within manufacturing tolerance. The unitary spoked mesh 300 is connected to the power supply via the stub 350 centrally located on the unitary spoked mesh 300. Manufacture of the unitary spoked mesh 300 with a single plane using a unitary sheet 333 of material allows precision in manufacture, less room for error, and prevents manufacturing issues with the outer electrode 303 not properly connecting to the power supply. Using a conductive single piece of material 333, the risk of the outer plasma modifying electrode 303 becoming partially or fully disconnected from the power supply is minimized as only the connection to the stub 350 is required to ensure full connection through the spokes 302.

The unitary spoke mesh 300 may be coupled to the bias power supply 117 for biasing and shaping the plasma sheath or otherwise modifying the properties of a plasma in the processing volume 121 adjacent to the outer circumference of the a substrate on the substrate receiving portion 156 through a power supply connection at the center stub 301, for example the aforementioned wire 370 (rod) connected to the center stub 301 through the plug 350. The plug 350 is, for example, 5 mm thick and configured of a material that will withstand the temperatures at which the electrostatic chuck assembly is operated and have sufficient electrical conductivity to not interfere with delivery of power to the unitary spoked mesh 300. The rod 370 is for example a solid Ni—Mo rod, for example 5 mm diameter. The unitary spoked mesh 300 is configured to operate independently of the chucking electrodes 154. However, the chucking electrodes 154 may optionally be coupled to the bias power supply 117 for shaping the plasma sheath in addition to the chucking power supply. A variable capacitor 241 may be disposed between the bias power supply 117 and the chucking electrodes 154 for isolating the chucking electrodes 154 from the active unitary spoke mesh 300. In one example, the unitary spoke mesh 300 may be energized while the chucking electrodes 154 are de-energized. However, it should be appreciated that the chucking electrodes 154 may be energized at the same time the unitary spoke mesh 300 is energized or alternately while the unitary spoke mesh 300 is de-energized.

In some examples, RF energy supplied by the bias power supply 117 may have a frequency of between about 350 KHz to about 60 MHz. In one example, the bias power supply 117 is configured to generate the RF signal overlaid on a pulsed voltage signal of the negative pulsed DC power source 140. In one example, the voltage waveform of the negative pulsed DC power source 140 may include a pulsed voltage signal range of about at 0.2 Hz to about 20 Hz with a duty cycle ranging from 10% to 100% overlaid with the RF signal of about 350 KHz to about 60 Mhz. The negative pulsed DC power source 140 is configured to provide a power profile to correct plasma sheath bending and maintain a substantially flat plasma sheath profile across the substrate 122.

The active edge electrode 303 of the unitary spoke mesh 300 may be spaced a distance 297 of about 2 mm to about 3 mm from the outer diameter 255. For example, the distance 297 from the active far edge electrode 303 may be about 2.5 mm from the outer diameter 255. The chucking electrodes 154 and the active edge electrode 303 may be a distance 291 of about 1.5 mm to about 3 mm, such as about 2.3 mm, below the first side 216. The active edge electrode 303 is extended to the very edge of the body 202 so that a denser plasma is obtained at the edges of the substrate 122 which reduces the edge exclusion region on the substrate 122 and in turn increases throughput.

The pulsing of the bias power supply 117 at very low duty cycles with a pulsing frequency between 0.2 Hz to 20 Hz prevents film damage by enabling bottom-up trench fill. The 0.2 Hz to 20 Hz level pulsing can be utilized for PECVD and PEALD processes for bottom-up filling of the trenches while preventing the sidewalls of the trenches from closing in and thus minimizing porous films.

The one or more heating elements 249 are embedded in the body 202 below the unitary spoke mesh 300. The heating elements 249 may be disposed a distance 294 of between about 4 mm and about 6 mm below the unitary spoke mesh 300, such as about 5 mm below the RF floating mesh 231. The heating elements 249 extend horizontally within the body 202 to between about 1.5 mm to about 3 mm from the outer diameter 255 of the body 202. In one example, the distance 297 the heating elements 249 extend horizontally within the body 202 is about 2.5 mm from the outer diameter 255 of the body 202.

The heating elements 249 may be arranged in one or more zones to control a temperature of the electrostatic chuck 152. For example, the heating elements 249 may be arranged in one, two or four zones for supplying a temperature to the substrate 122. The heating elements 249 may have a hollow in the center of the diameter of the body 202 through which power supply wires may pass. The heating elements 249 are coupled to a power source 248, e.g., an AC power source, to power the heating elements 249. The one or more heating elements 249 are configured to supply a temperature to the substrate of about 200 degrees Celsius to about 700 degrees Celsius. For example, the electrostatic chuck 152 is configured to operate at temperatures exceeding 600 degrees Celsius, such as about 650 degrees Celsius.

Advantageously, the electrostatic chuck 152 can be used for both the PECVD/PEALD deposition and in-situ etch/treatment process while having superior wafer edge coverage using the active edge electrode 300. The electrostatic chuck 152 also has a reduced footprint due to the embedded ground electrode that helps prevent plasma light up, i.e., arcing, in the gaps as seen in previous approaches to conventional grounding of electrostatic chucks.

The unitary spoke mesh comprises at its center, the stub 301 capable of being connected to a power supply, for example through the conductive plug applied thereon at the center of the stub 301. T In one example, the unitary spoke mesh 300 is shaped with four or six spoke 302 sections radiating outwards from the center of the body 202. In another example, the unitary spoke mesh 300 has greater that six sections radiating outwards from the center of the body 202. In another example, the unitary spoke mesh 300 is disc shaped wherein the outer edge of the edge electrode follows a circular path and the edge electrode is a continuous portion of the mesh.

While the foregoing is directed to embodiments of the present disclosure, other and further embodiments of the disclosure may be devised without departing from the basic scope thereof, and the scope thereof is determined by the claims that follow.

The invention claimed is:

1. A substrate support, comprising:
   a ceramic body,
   at least one heater,
   at least one chucking electrode, and
   a unitary plasma support structure comprising an electrical connection portion, at least one electrical distribution portion, and an annular electrode connected to the electrical connection portion by the at least one electrical distribution portion, the electrical connection portion, at least one electrical distribution portion, and the annular electrode connected to the electrical connection portion extending within the ceramic body in a plane
   the unitary plasma support structure further comprising a conductive plug disposed within the ceramic body, an opening inwardly of the electrostatic chuck to the conductive plug and a distal end of one wire of a plurality of conductive wires is received in the conductive plug within the ceramic body.

2. The substrate support of claim 1, wherein the unitary plasma support structure comprises a conductive wire mesh.

3. The substrate support of claim 1, wherein the depth of the electrical connection portion, at least one electrical distribution portion, and annular electrode within the ceramic body are the same depth within the ceramic body.

4. The substrate support of claim 1, wherein the ceramic body includes a substrate receiving portion and an extending portion extending radially outwardly of the substrate support portion.

5. The substrate support of claim 1, wherein the electrical connection portion, at least one electrical distribution portion, and annular electrode are comprised of a unitary conductive wire mesh.

6. The substrate support of claim 1 wherein the electrical connection portion is a circular portion of mesh, from which the at least one electrical distribution portion extends from the outer circumference thereof.

7. The substrate support of claim 6, wherein the at least one chucking electrode comprises a wire mesh.

8. A substrate support, comprising:
   a ceramic body, at least one heater, at least one chucking electrode, and a unitary plasma support structure comprising an electrical connection portion, at least one electrical distribution portion, and annular electrode connected to the electrical connection portion by the at least one electrical distribution portion, the electrical connection portion, at least one electrical distribution portion, and annular electrode configured of a unitary sheet of a conductive fiber mesh the unitary plasma support structure further comprising a conductive plug, wherein a distal end of one wire of a plurality of conductive wires is received in the conductive plug.

9. The substrate support of claim 8, wherein the conductive fiber of the conductive fiber mesh comprises wires.

10. The substrate support of claim 8, wherein the depth of the electrical connection portion, at least one electrical distribution portion, and annular electrode within the ceramic body are the same depth within the ceramic body.

11. The substrate support of claim 8, wherein the ceramic body includes a substrate receiving portion and an extending portion extending radially outwardly of the substrate support portion.

12. The substrate support of claim 8, wherein the electrical connection portion, at least one electrical distribution portion, and annular electrode are comprised of a unitary conductive wire mesh.

13. The substrate support of claim 8 wherein the electrical connection portion is a circular portion of mesh, from which the at least one electrical distribution portion extends from the outer circumference thereof.

14. The substrate support of claim 13, wherein the at least one chucking electrode comprises a wire mesh.

* * * * *